US012772799B2

(12) United States Patent
Lin et al.

(10) Patent No.: US 12,772,799 B2
(45) Date of Patent: Oct. 20, 2026

(54) STRESS MANAGEMENT FOR PRECISE SUBSTRATE-TO-SUBSTRATE BONDING

(71) Applicant: Applied Materials, Inc., Santa Clara, CA (US)

(72) Inventors: San-Kuei Lin, Los Gatos, CA (US); Pradeep Kumar Subrahmanyan, San Jose, CA (US); Wonjae Lee, Fremont, CA (US); Ramkumar Karur Shanmugam, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 376 days.

(21) Appl. No.: 18/431,860

(22) Filed: Feb. 2, 2024

(65) Prior Publication Data

US 2024/0266186 A1 Aug. 8, 2024

Related U.S. Application Data

(60) Provisional application No. 63/511,414, filed on Jun. 30, 2023, provisional application No. 63/502,448, (Continued)

(51) Int. Cl.
*H10P 74/20* (2026.01)
*C23C 14/48* (2006.01)
(Continued)

(52) U.S. Cl.
CPC ............ *H10P 74/203* (2026.01); *C23C 14/48* (2013.01); *C23C 14/54* (2013.01); *C23C 14/547* (2013.01);
(Continued)

(58) Field of Classification Search
CPC ......................... H10P 72/0616; H10P 72/7434
See application file for complete search history.

(56) References Cited

U.S. PATENT DOCUMENTS

| | | | |
|---|---|---|---|
| 10,754,319 | B1 | 8/2020 | Good et al. |
| 10,818,611 | B2 | 10/2020 | Chang et al. |

(Continued)

FOREIGN PATENT DOCUMENTS

| | | | |
|---|---|---|---|
| CN | 111725051 A | 9/2020 | |
| CN | 113594309 A | 11/2021 | |

(Continued)

OTHER PUBLICATIONS

International Search Report and Written Opinion for International Application No. PCT/US2024/014670, mailed Jun. 10, 2024, 8 Pages.

(Continued)

*Primary Examiner* — Evren Seven
(74) *Attorney, Agent, or Firm* — Lowenstein Sandler LLP

(57) ABSTRACT

Disclosed systems and techniques are directed to mitigating stresses in substrate-to-substrate bonding processes. Disclosed techniques include obtaining a first substrate supporting transferred feature(s) (TFs) and transferring TFs from the first substrate to a second substrate, transferring TFs from the first substrate to the second substrate, and applying stress mitigation to a target substrate. The target substrate can be the first substrate, an auxiliary substrate supporting TFs prior to transferring TFs from the auxiliary substrate to the first substrate, or the second substrate. Applying stress mitigation to the target substrate includes obtaining an out-of-plane deformation (OPD) profile of the target substrate, causing a stress compensation layer (SCL) to be deposited on the target substrate, and exposing the SCL to a stress-mitigation beam. Settings of the SCL and/or the stress-mitigation beam are determined using the OPD profile of the target substrate.

20 Claims, 10 Drawing Sheets

Related U.S. Application Data filed on May 16, 2023, provisional application No. 63/502,447, filed on May 16, 2023, provisional application No. 63/502,452, filed on May 16, 2023, provisional application No. 63/491,170, filed on Mar. 20, 2023, provisional application No. 63/444,158, filed on Feb. 8, 2023.

(51) Int. Cl.

| | |
|---|---|
| ***C23C 14/54*** | (2006.01) |
| ***G01B 9/02*** | (2022.01) |
| ***G01B 11/16*** | (2006.01) |
| ***H10P 14/60*** | (2026.01) |
| ***H10P 14/694*** | (2026.01) |
| ***H10P 30/20*** | (2026.01) |
| ***H10P 30/40*** | (2026.01) |
| ***H10P 72/00*** | (2026.01) |
| ***H10P 74/00*** | (2026.01) |
| ***H10W 42/00*** | (2026.01) |

(52) U.S. Cl.

CPC .......... *G01B 9/02095* (2013.01); *G01B 11/16* (2013.01); *G01B 11/162* (2013.01); *H10P 14/6518* (2026.01); *H10P 14/6539* (2026.01); *H10P 30/20* (2026.01); *H10P 30/40* (2026.01); *H10P 72/0616* (2026.01); *H10P 74/23* (2026.01); *H10W 42/121* (2026.01); *H10P 14/69433* (2026.01)

(56) References Cited

U.S. PATENT DOCUMENTS

| | | | | |
|---|---|---|---|---|
| 10,847,419 | B2 | 11/2020 | Miller et al. | |
| 2005/0278126 | A1 | 12/2005 | Rosakis et al. | |
| 2006/0123919 | A1 | 6/2006 | Lovell et al. | |
| 2006/0276977 | A1 | 12/2006 | Rosakis et al. | |
| 2007/0180919 | A1 | 8/2007 | Rosakis et al. | |
| 2011/0037155 | A1 | 2/2011 | Pagaila | |
| 2012/0286285 | A1 | 11/2012 | Godet et al. | |
| 2014/0107998 | A1 * | 4/2014 | Vukkadala | G06F 30/23 703/14 |
| 2016/0005662 | A1 | 1/2016 | Yieh et al. | |
| 2017/0125268 | A1 | 5/2017 | Dang et al. | |
| 2017/0162522 | A1 | 6/2017 | Chang et al. | |
| 2017/0178891 | A1 | 6/2017 | Batinica et al. | |
| 2017/0287752 | A1 | 10/2017 | Godet et al. | |
| 2018/0067403 | A1 | 3/2018 | Devilliers | |
| 2018/0329310 | A1 | 11/2018 | Coskun et al. | |
| 2019/0041758 | A1 | 2/2019 | Van Dijk et al. | |
| 2019/0287854 | A1 | 9/2019 | Miller et al. | |
| 2019/0378737 | A1 | 12/2019 | Gutman et al. | |
| 2019/0393069 | A1 * | 12/2019 | Paranjpe | H10P 72/74 |
| 2020/0118822 | A1 * | 4/2020 | Falk | H10P 30/20 |
| 2021/0047729 | A1 | 2/2021 | Yao et al. | |
| 2021/0050411 | A1 | 2/2021 | Zhang et al. | |
| 2021/0247701 | A1 | 8/2021 | Li et al. | |
| 2021/0264076 | A1 * | 8/2021 | Yamamoto | G06F 30/20 |
| 2022/0068648 | A1 * | 3/2022 | Falk | H10P 30/20 |
| 2022/0344171 | A1 * | 10/2022 | Varghese | H10P 30/40 |
| 2022/0344282 | A1 | 10/2022 | Subrahmanyan et al. | |

FOREIGN PATENT DOCUMENTS

| | | | |
|---|---|---|---|
| JP | 2001068429 | A | 3/2001 |
| JP | 2020148865 | A | 9/2020 |
| KR | 20180021133 | A | 2/2018 |
| KR | 20200015426 | A | 2/2020 |
| WO | 2017038026 | A1 | 3/2017 |
| WO | 2022119732 | A1 | 6/2022 |

OTHER PUBLICATIONS

International Search Report and Written Opinion for International Application No. PCT/US2024/014674, mailed Jun. 10, 2024, 9 Pages.

International Search Report and Written Opinion for International Application No. PCT/US2024/014676, mailed Jun. 10, 2024, 10 Pages.

International Search Report and Written Opinion for International Application No. PCT/US2024/014884, mailed May 27, 2024, 08 Pages.

International Search Report and Written Opinion for International Application No. PCT/US2024/014939, mailed Jun. 14, 2024, 09 Pages.

* cited by examiner

STRESS MANAGEMENT FOR PRECISE SUBSTRATE-TO-SUBSTRATE BONDING

RELATED APPLICATIONS

This application claims the benefit of U.S. Provisional Patent Application No. 63/444,158, filed Feb. 8, 2023, entitled "Mitigation of stress and deformation in wafers"; U.S. Provisional Patent Application No. 63/491,170, filed Mar. 20, 2023, entitled "Optimized film deposition and ion implantation for mitigation of stress and deformation in wafers"; U.S. Provisional Patent Application No. 63/502,447, filed May 16, 2023, entitled "Mitigation of saddle deformation of wafers using film deposition and edge ion implantation"; U.S. Provisional Patent Application No. 63/502,448, filed May 16, 2023, entitled "Influence function-based mitigation of wafer deformation with film deposition and ion implantation"; U.S. Provisional Patent Application No. 63/502,452, filed May 16, 2023, entitled "Cylindric decomposition for efficient mitigation of wafer deformation with film deposition and ion implantation"; and U.S. Provisional Patent Application No. 63/511,414, filed Jun. 30, 2023, entitled "Wafer stress management for precise wafer-to-wafer bonding," the contents of which are incorporated by reference in their entirety herein.

TECHNICAL FIELD

The disclosure pertains to semiconductor manufacturing, including manufacturing of wafers.

BACKGROUND

Modern semiconducting devices, such as processing circuits, memory devices, light detectors, solar cells, light-emitting semiconductor devices, devices that deploy complementary metal-oxide-semiconductor (CMOS) structures, and the like, are often manufactured on silicon wafers (or other suitable substrates). Wafers may undergo numerous processing operations, such as physical vapor deposition, chemical vapor deposition, etching, photo-masking, polishing, and/or various other operations. In a continuous effort to reduce the cost of semiconductor devices, multi-layer stacks of dies, insulating films, patterned and/or doped semiconducting films, and/or other features are often deposited on a single wafer, resulting in high aspect ratio devices, which are used, e.g., in 3D flash memory devices and other applications. Deposition, patterning, etching, polishing, etc., of stacks of multi-layered structures often result in significant stresses applied to the underlying wafers. Such stresses lead to both an out-of-plane distortion and an in-plane distortion of features supported by the wafers. These distortions result in misalignment of deposited features and can significantly degrade quality of manufactured devices.

BRIEF DESCRIPTION OF THE DRAWINGS

The present disclosure will be understood more fully from the detailed description given below and from the accompanying drawings of various implementations of the disclosure.

SUMMARY

Figure 1A:
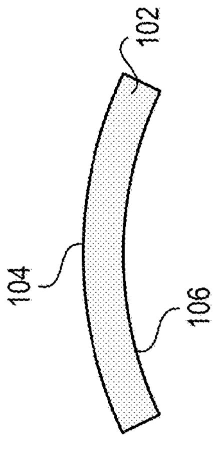
FIGS. 1A-E illustrate schematically a process of stress-correcting a back side-deposited film with an additional ion implantation, according to at least one embodiment.

In one embodiment, disclosed is a method that includes obtaining a first substrate supporting one or more transferred features (TFs) and transferring the one or more TFs from the first substrate to a second substrate. The method further includes transferring the one or more TFs from the first substrate to the second substrate. The method further includes applying stress mitigation to a target substrate, wherein the target substrate comprises at least one of the first substrate, an auxiliary substrate supporting the one or more TFs prior to transferring the one or more TFs from the auxiliary substrate to the first substrate, or the second substrate. Applying stress mitigation to the target substrate includes obtaining, using optical inspection data, an out-of-plane deformation (OPD) profile of the target substrate, causing a stress compensation layer (SCL) to be deposited on the target substrate, and exposing the SCL to a stress-mitigation beam Settings of at least one or more of (i) the SCL or (ii) the stress-mitigation beam are determined using the OPD profile of the target substrate.

In another embodiment, disclosed is a system that includes a memory and a processing device communicatively coupled to the memory. The processing device to cause performance of operations that include obtaining a first substrate supporting one or more TFs, transferring the one or more TFs from the first substrate to a second substrate, and applying stress mitigation to a target substrate. The target substrate is at least one of the first substrate, an auxiliary substrate supporting the one or more TFs prior to transferring the one or more TFs from the auxiliary substrate to the first substrate, or the second substrate. Applying stress mitigation to the target substrate includes obtaining, using optical inspection data, an OPD profile of the target substrate, causing an SCL to be deposited on the target substrate; and exposing the SCL to a stress-mitigation beam. Settings of at least one or more of (i) the SCL or (ii) the stress-mitigation beam are determined using the OPD profile of the target substrate.

In another embodiment, disclosed is a semiconductor manufacturing system that includes one or more processing chambers to process a substrate and a computing device. The computing device is to cause performance of operations that include obtaining a first substrate supporting one or more TFs, transferring the one or more TFs from the first substrate to a second substrate, and applying stress mitigation to a target substrate. The target substrate is at least one of the first substrate, an auxiliary substrate supporting the one or more TFs prior to transferring the one or more TFs from the auxiliary substrate to the first substrate, or the second substrate. Applying stress mitigation to the target substrate includes obtaining, using optical inspection data, an OPD profile of the target substrate, causing an SCL to be deposited on the target substrate; and exposing the SCL to a stress-mitigation beam. Settings of at least one or more of (i) the SCL or (ii) the stress-mitigation beam are determined using the OPD profile of the target substrate.

In yet another embodiment, disclosed is a non-transitory computer-readable memory storing instructions thereon that, when executed by a processing device, cause the processing device to cause performance of operations that include obtaining a first substrate supporting one or more TFs, transferring the one or more TFs from the first substrate to a second substrate, and applying stress mitigation to a target substrate. The target substrate is at least one of the first substrate, an auxiliary substrate supporting the one or more TFs prior to transferring the one or more TFs from the auxiliary substrate to the first substrate, or the second substrate. Applying stress mitigation to the target substrate includes obtaining, using optical inspection data, an OPD profile of the target substrate, causing an SCL to be deposited on the target substrate, and exposing the SCL to a stress-mitigation beam. Settings of at least one or more of (i) the SCL or (ii) the stress-mitigation beam are determined using the OPD profile of the target substrate.

DETAILED DESCRIPTION

Modern technology often aims to maximize chip area utilization by manufacturing three-dimensional devices having multiple layers of semiconducting structures. For example, in NAND flash memory devices, lateral relative arrangement (CMOS near Array, or CnA) of memory cells (e.g., floating gate transistors) and peripheral transistors (e.g., CMOS circuitry used to support write/read operations with memory cells) has mostly given way to a vertical arrangement (CMOS under Array, or CuA) in which peripheral CMOS circuitry is disposed below an array of memory cells. Deposition of memory cells on top of a previously deposited CMOS circuitry, however, limits the range of temperatures available for memory cell deposition since higher temperatures (e.g., 800-1200° C.) desired for efficient cell deposition can be detrimental for the integrity of the deposited CMOS circuitry. It is, therefore, advantageous to initially deposit memory cells on one wafer, e.g., wafer A, while depositing the peripheral circuitry on another wafer, e.g., wafer B, and then transfer memory cells from wafer A to wafer B, bonding the cells to the corresponding circuitry.

Patterning and/or depositing memory cells/CMOS circuitry, however, can cause stress in wafer A and/or wafer B, which induces deformation in the respective wafer(s), e.g., a parabolic deformation, a cylindric deformation, a saddle deformation, or some more complicated deformation, and/or a combination thereof. Deformation of the wafers makes alignment of various features deposited/etched/patterned on the wafers difficult. This results in an increase of sub-optimally processed wafers and a corresponding decrease in the yield of the manufacturing process.

Existing technology includes a number of methods that address wafer deformation. For example, a deformed (warped) wafer with various films and features deposited on one side (referred to as the front side, top side, or main side herein) can be coated on the other side (referred to as the back side or bottom side herein) with a film that exerts a compression stress or tensile stress on the wafer. Such a back side-deposited deformation-correcting film, also referred to as a stress-compensation layer herein, usually imparts a uniform (or global) stress to the entire wafer and cannot compensate for local stress modulation and/or anisotropic stress. Additional correction can be achieved by implanting ions into the stress-compensation layer, e.g., using a beam of ions to bombard the stress-compensation layer, to adjust the stress in the stress-compensation layer and, consequently, to further mitigate the deformation of the underlying wafer.

A "wafer," as used herein, refers to any substrate or material surface formed on a substrate upon which film processing is performed during a fabrication process. For example, a wafer surface on which processing can be performed includes materials such as silicon, silicon oxide, silicon nitride, strained silicon, silicon on insulator, carbon doped silicon oxides, amorphous silicon, doped silicon, germanium, gallium arsenide, glass, sapphire, and any other materials such as metals, metal nitrides, metal alloys, and other conductive materials, depending on the application. Wafers include, without limitation, semiconductor wafers. In some instances, wafers can include plastic substrates. Wafers may be exposed to a pretreatment process to polish, etch, reduce, oxidize, hydroxylate, anneal, UV cure, e-beam cure and/or bake the substrate surface. In addition to film processing directly on the surface of the wafer itself, any of the film processing steps disclosed may also be performed on an underlayer formed on the wafer as disclosed in more detail below, and the term "wafer surface" is intended to include such underlayer as the context indicates. Thus, for example, where a film/layer or partial film/layer has been deposited onto a wafer surface, the exposed surface of the newly deposited film/layer becomes the wafer surface. In some embodiments, wafers have a thickness in the range of 0.25 mm to 1.5 mm, or in the range of 0.5 mm to 1.25 mm, in the range of 0.75 mm to 1.0 mm, or more. In some embodiments, wafers have a diameter of about 10 cm, 20 cm, 30 cm, or more.

Figure 5:
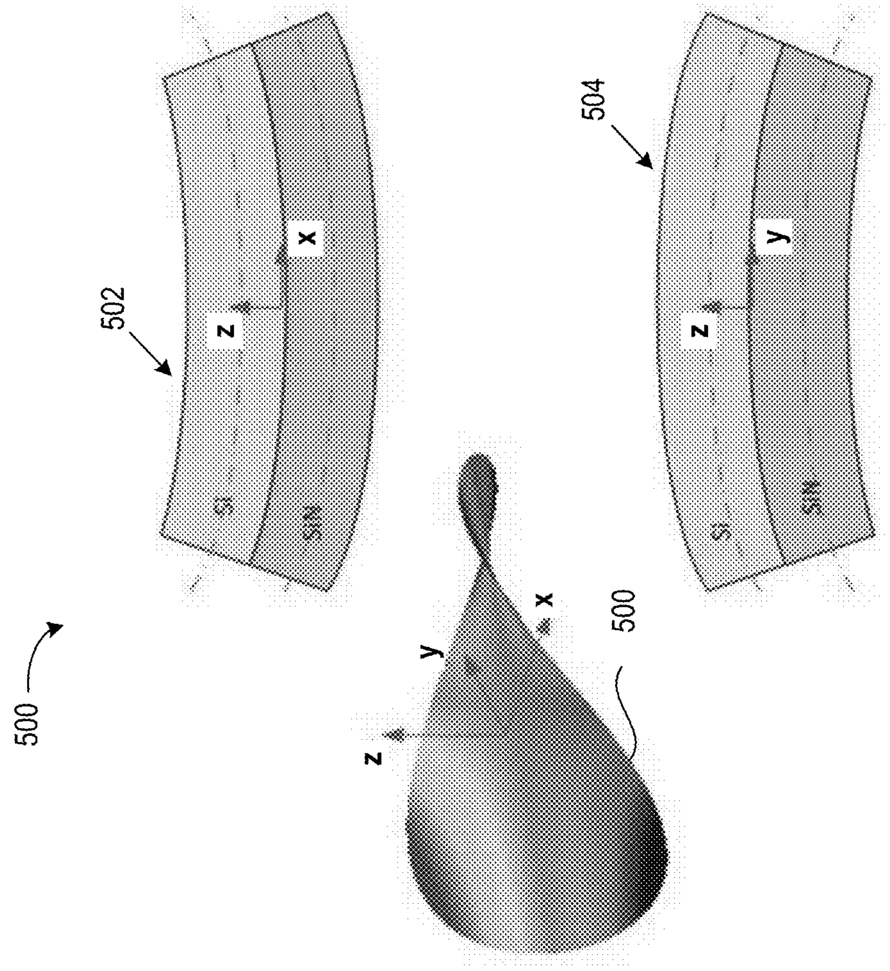
FIG. 5 illustrates an example silicon wafer with a Silicon Nitride film deposited thereon having a saddle-shaped deformation, according to at least one embodiment.

Deposition of stress-compensation layers with ion implantation can be quite efficient in correcting stresses that are uniform and isotropic, $\sigma_{xx} \approx \sigma_{yy}$. On the other hand, mitigating stresses that vary with location x, y on the wafer, $\sigma_{jk}$ (x,y), stresses that are anisotropic, $\sigma_{xx} \neq \sigma_{yy}$, or both is a much more challenging problem. Certain feature patterns can result in stresses that are compressive along one direction, e.g., $\sigma_{xx}>0$, and tensile along a perpendicular direction, $\sigma_{yy}<0$, resulting in saddle-shaped wafers, e.g., as illustrated in FIG. 5. Such saddle-shaped features can arise, for example, in stacks of materials with directional patterning, e.g., patterning of wordlines in flash memory devices. Correcting such anisotropic saddle deformations in wafers remains a difficult task.

Aspects and implementations of the present disclosure address these and other challenges of the modern semiconductor manufacturing technology by providing for systems and techniques that can mitigate non-uniform and/or anisotropic stresses and deformations (e.g., out-of-plane deformations) of wafers prior to wafer-on-wafer bonding. In some embodiments, a wafer's deformation can be measured (e.g., using optical measurements techniques) and parameters of a stress-compensation layer (e.g., layer's material, thickness, etc.) can be determined such that the sign of the stress is the same throughout the wafer. For example, if the wafer's deformation is concave, the parameters of the stress-compensation layer can be selected to overcorrect the wafer into a convex shape. An ion implantation map (a distribution of local doses of ion implants) n(x,y) can then be computed to reduce the local stress in the wafer to a degree that brings the convex shape to a flat (or nearly flat) shape. A number of techniques may be used to determine optimal ion implantation maps.

In some embodiments, a vertical profile of wafer deformation $z=h(\vec{r})$ can be measured using optical metrology (e.g., optical interferometry) techniques. The wafer profile $h(\vec{r})$ can then be represented via a number of parameters that qualitatively and quantitatively characterize geometry of the wafer deformation, e.g., a set of Zernike (or a similar set of) polynomials, $h(\vec{r})=\Sigma_j A_j Z_j(\vec{r})$. Consecutive coefficients $A_1$, $A_2$, $A_3$, $A_4$ . . . represent weights of specific geometric features (elemental deformations) of the wafer described by the corresponding Zernike polynomials $Z_j(\vec{r})$. In some embodiments, a material of stress-compensation layer (e.g., a tensile or compressive film) can be selected based on the sign of a paraboloid bow coefficient coefficient $A_4$. In some embodiments, selection of a thickness d of a stress-compensation layer can be made based on a value of the paraboloid bow coefficient $A_4$. The stress-compensation layer can be deposited using any suitable deposition techniques including physical vapor deposition (e.g., sputtering), chemical vapor deposition (e.g., plasma-assisted deposition), epitaxy, exfoliation, and/or the like. Deposition can be performed at room temperature or at temperatures different from room temperature (e.g., at an elevated temperature). In some embodiments, thickness d of stress-compensation layer can be selected to overcorrect the deformation to some degree. The overcorrection can be chosen in conjunction with the implant species, energy, and dose to ensure maximum effect from the stress compensation. Stress in the combined structure of the wafer and the stress-compensation layer can be further controlled by an ion implantation beam that strikes the stress-compensation layer and deposits ions therein. Substitution defects and/or vacancies created by the beam of ions modify (e.g., reduce) stress in the stress-compensation layer and can reduce the degree of stress overcorrection caused by the film deposition. This causes the combination of the wafer and the stress-compensation layer to flatten.

In some embodiments, the number of ions deposited per various areas of the wafer can be determined using simulations, e.g., Monte Carlo simulations. The Monte Carlo simulations can be performed for a film made of the actual material used in deposition and having a specific thickness d. An initial Monte Carlo simulation can be performed for specific baseline (default) conditions of the ion implantation (e.g., default settings of an ion implantation apparatus). The baseline conditions can include a default type of ions, a default energy of ions, a default dose of ions to be imparted to the film (e.g., a default velocity of scanning and a default scanning pattern), and the like. The baseline conditions can subsequently be modified (e.g., optimized) using the Monte Carlo simulations. The Monte Carlo simulations can use measurement data (calibration data) collected for actual ion implantation performed for various ion energies, types of ions, types and materials of deposition films, angles of ion incidence on the films, and/or the like.

In some embodiments, the implantation map $n(\vec{r})$ can be computed using an influence function $G(\vec{r}; \vec{r}')$ that characterizes a response (e.g., deformation) at a point $\vec{r}$ of the wafer as caused by a point-like force applied at another point $\vec{r}'$ of the wafer. In some embodiments, the influence function $G(\vec{r}; \vec{r}')$, also known as the Green's function, can be determined from computational simulations or from analytical calculations. In some embodiments, the implantation map $n(\vec{r})$ can be determined by accessing a stored dataset that includes a representation of the influence function $G(\vec{r}; \vec{r}')$ for the target wafer and performing a regression computation to determine, based on the deformation of the target wafer and using $G(\vec{r}; \vec{r}')$, a distribution of ion implants into the SCL. In some embodiments, the influence function can be determined from one or more experiments, which can include performing ion implantation into a film deposited on a reference wafer.

In some embodiments, wafer deformation $h(\vec{r})=h_{quad}(\vec{r})+h_{res}(\vec{r})$ can be represented (decomposed) as a combination of a quadratic $h_{quad}(\vec{r})$ and residual (non-quadratic) $h_{res}(\vec{r})$ contributions. The quadratic deformation can include a parabolic (paraboloid) part $h_{par}(r)$, which has the complete axial symmetry, and a saddle part $h_{saddle}(\vec{r})$. The thickness of the stress-compensation layer d can be computed (or empirically determined) in such a way that the layer is to apply a desired target stress to the back side of the wafer. To eliminate a non-uniform saddle deformation, the stress-compensation film can be of such thickness/material that turn the saddle deformation into a cylindric deformation having a definite sign throughout the entire area of the wafer. The uniform-sign cylindric deformation (as well as a residual higher-order non-quadratic deformation) can then be mitigated with ion implantation into the film. In some embodiments, a cylindric decomposition is not unique and can be either positive (upward-facing cylinder deformation) or negative (downward-facing cylinder deformation). Both decompositions can be analyzed and a decomposition that enables a more effective stress mitigation can be selected. For example, a decomposition that is characterized by a smaller parabolic bow deformation can be selected. The parabolic bow deformation can be mitigated using a film deposition while the remaining cylindric deformation (and the higher-order residual deformation) can be addressed by appropriately selected ion implantation doses $n(\vec{r})$.

In some embodiments, mitigation of a cylindric deformation or a saddle deformation can include identifying principal axes (directions) of the cylinder/saddle and a magnitude of the cylindric/saddle deformation and depositing ions into appropriately selected edge regions of the stress-compensation layer. For example, the edge regions of the SCL can have a width that is at or below 30% of a diameter of the target wafer. Residual higher-order (ripple) deformations can then be mitigated with further ion implantation assist features into the area of the film.

In some embodiments, the stress-mitigation beam can delivering, to the SCL, a spatially uniform dose of ions, a radially-varying dose of ions, and/or an azimuthally-varying dose of ions These and/or similar techniques can be applied, as part of a wafer-to-wafer bonding process, to stress mitigation of wafer A, wafer B, or both. In some embodiments, these or similar techniques can be applied to any additional (e.g., auxiliary or carrier) wafer that is used in the bonding process. For example, an initial wafer with any set of features (e.g., dies with memory cells) can be manufactured and subsequently cut into individual dies that are placed on a carrier wafer (reconstituted wafer A) before being transferred to wafer B. In such instances, the disclosed stress-mitigation techniques can be applied to the initial wafer A, the carrier wafer A, and/or receiving wafer B. Features and techniques described in conjunction with any of FIGS. 1-5 can be applied to any of the wafers that are used in the course of the wafer-to-wafer bonding process.

Some of these techniques will now be described in more detail. In one embodiment, a vertical profile of wafer deformation $z=h(\vec{r})$ can be measured using optical metrology techniques. For example, an interferogram of the profile $h(\vec{r})$ can be obtained using optical interferometry measurements. The wafer profile $h(\vec{r})$ can then be represented via a number of parameters that qualitatively and quantitatively characterize geometry of the wafer deformation. In some embodiments, a set of Zernike (or a similar set of) polynomials may be used to represent the wafer profile, $$h(\vec{r}) = \sum_j A_j Z_j(\vec{r}),$$

where the planar radius-vector $\vec{r}=(r,\phi)$ may be represented as the radial coordinate r and the polar angle $\phi$ within the (average) plane of the wafer. Consecutive coefficients $A_1$, $A_2$, $A_3$, $A_4$ . . . represent weights of specific geometric features (elemental deformations) of the wafer described by the corresponding Zernike polynomials $Z_1(r,\phi)$, $Z_2(r,\phi)$, $Z_3(r,\phi)$, $Z_4(r,\phi)$ . . . . (Herein, the Noll indexing scheme for the Zernike polynomials is being used.) The first three coefficients are of less interest as they describe a uniform shift of the wafer (coefficient $A_1$, associated with the $Z_1(r,\phi)=1$ polynomial), a deformation-free x-tilt that amounts to a rotation around the y-axis (coefficient $A_2$, associated with the $Z_2(r,\phi)=2r\cos 0$ polynomial), and a deformation-free x-tilt that amounts to a rotation around the x-axis (coefficient $A_3$, associated with the $Z_3(r,\phi)=2r\sin 0$ polynomial) that can be eliminated by a realignment of the coordinate axes. The fourth coefficient $A_4$ is associated with $Z_4(r,\phi)=\sqrt{3}(2r^2-1)$ and characterizes an isotropic paraboloid deformation ("bow"). The fifth $A_5$ and the sixth $A_6$ coefficients are associated with $Z_5(r,\phi)=\sqrt{6}r^2\sin 2\phi$ and $Z_6(r,\phi)=\sqrt{6}r^2\cos 2\phi$ polynomials, respectively, and characterize a saddle-type deformation. The $A_5$ coefficient characterizes a saddle shape that curves up ($A_5>0$) or down ($A_5<0$) along the diagonal y=x and curves down ($A_5>0$) or up ($A_5<0$) along the diagonal y=−x. The $A_6$ coefficient characterizes a saddle shape that curves up ($A_6>0$) or down ($A_6<0$) along the x-axis and curves down ($A_6>0$) or up ($A_6<0$) along the y-axis. The higher coefficients $A_7$, $A_8$, etc., characterize progressively faster variations of the wafer deformation $h(r,\phi)$ along the radial direction, along the azimuthal direction, or both and collectively represent a residual deformation, $$h_{res}(r,\phi) = h(r,\phi) - \sum_{j=4}^{6} A_j Z_j(r,\phi).$$

Figure 2:
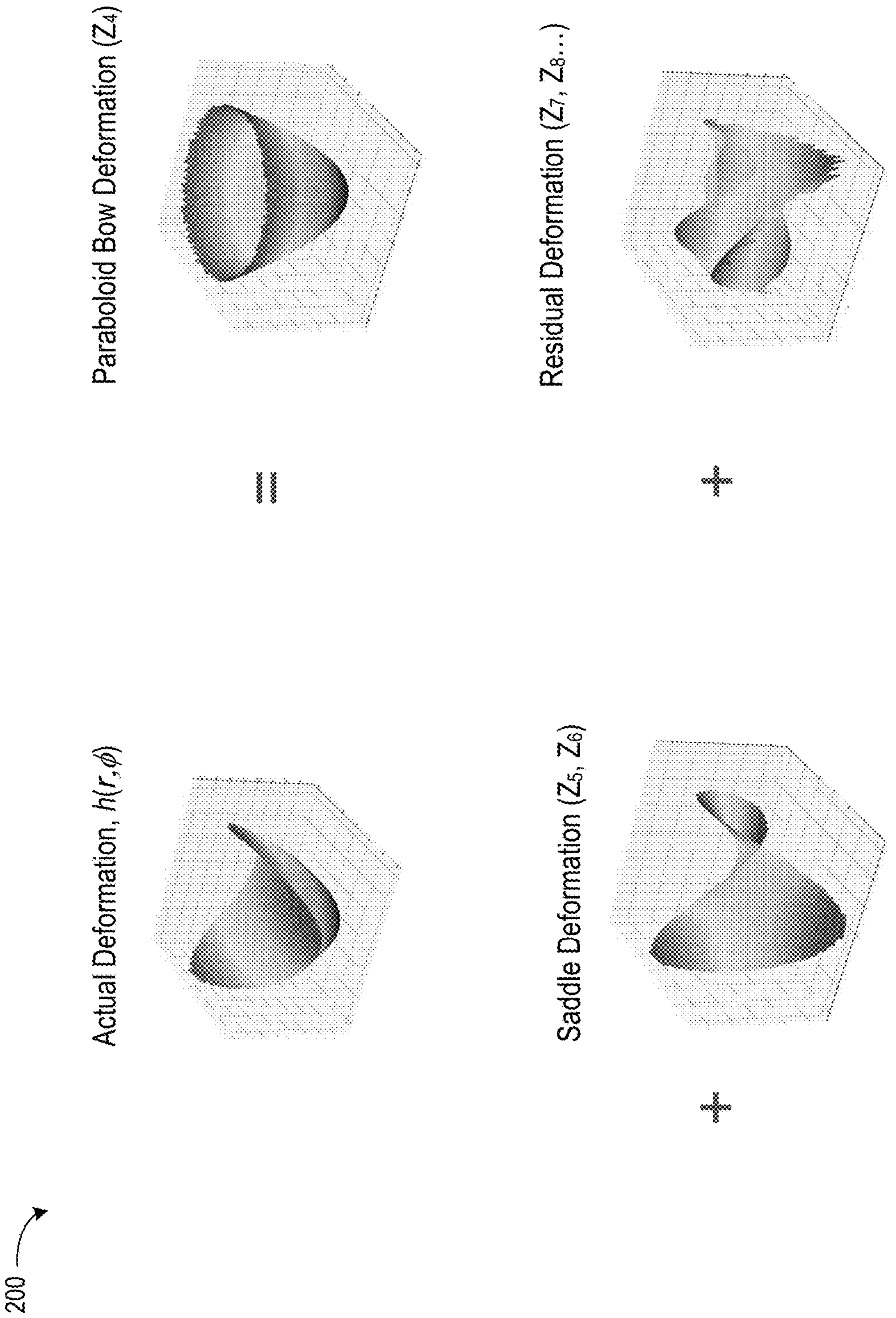
FIG. 2 illustrates an example Zernike polynomial decomposition of one actual deformation (top left) of a wafer, in arbitrary units, into a paraboloid bow deformation (top right), a saddle deformation (bottom left), and a residual deformation (bottom right), according to at least one embodiment.

FIG. 2 illustrates an example Zernike polynomial decomposition 200 of one actual deformation $h(r,\phi)$ (top left) of a wafer, in arbitrary units, into a paraboloid bow deformation $A_4Z_4(r,\phi)$ (top right), a saddle deformation $A_5Z_5(r,\phi)+A_6Z_6(r,\phi)$ (bottom left), and a residual deformation, $h_{res}(r,\phi)$ (bottom right), according to at least one embodiment.

Figure 1B:
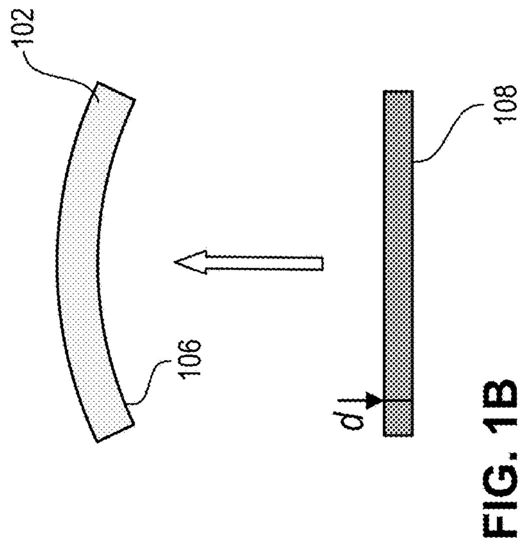

In some embodiments, selection of a thickness d of the stress-compensation film can be made based on a value of the paraboloid bow coefficient $A_4$. FIGS. 1A-E illustrate schematically a process of stress-correcting the back side-deposited film with an additional ion implantation, according to at least one embodiment. FIG. 1A depicts a wafer 102 having a deformation, which can include a paraboloid bow deformation (with negative coefficient $A_4<0$) and other deformations, e.g., a saddle deformation and a residual deformation (both not shown in FIGS. 1A-E for conciseness and ease of viewing). Wafer 102 has a front side 104 and a back side 106. Any number of features (e.g., deposition and/or etching patterns), dies, photo-masks, and/or any other structures can be deposited on or etched in the front side 104. In some embodiments, back side 106 can be free from deposited/etched features/structures. In some embodiments, back side 106 can also have one or more deposited/etched features/structures. FIG. 1B illustrates schematically deposition of a stress-compensation layer on the back side of wafer 102. In some embodiments, stress-compensation layer 108 can include one or more films of different materials. Individual films may have a thickness in the range of 10 nm to 200 nm, or in the range of 20 nm to 180 nm, or in the range of 30 nm to 160 nm, or in the range of 40 nm to 140 nm, or more. A total thickness of the stress-compensating layer may be up to several microns or even more. In some embodiments, stress-compensation layer 108 is deposited at a temperature in the range of 100° C. to 500° C. or higher.

Figure 1C:
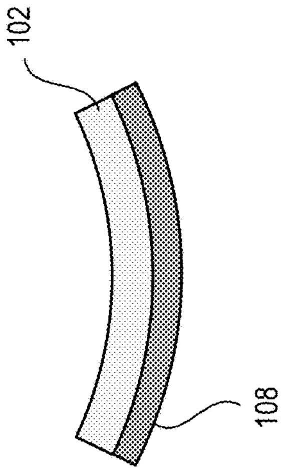

A material (type) of stress-compensation layer 108 can be selected based on the sign of coefficient $A_4$. For example, for a negative bow, $A_4<0$, and stress-compensation layer 108 can be selected to have a compressive stress (as illustrated in FIGS. 1A-E). For silicon wafers, such a film can be a silicon nitride ($Si_3N_4$) film. Conversely, for a positive bow, $A_4>0$, and stress-compensation layer 108 may be selected to have a tensile stress (not shown in FIGS. 1A-E). Stress-compensation layer 108 can be deposited using any suitable deposition techniques including physical vapor deposition (e.g., sputtering), chemical vapor deposition (e.g., plasma-assisted deposition), epitaxy, exfoliation, and/or the like. Deposition can be performed at room temperature or at temperatures different from room temperature (e.g., at an elevated temperature). In some embodiments, a thickness d of stress-compensation layer 108 can be selected to over-correct the deformation to some degree, e.g., as illustrated in FIG. 1C where a negative paraboloid bow becomes a positive paraboloid bow. The thickness-dependent paraboloid bow correction $A_{corr}(d)$ changes wafer deformation from $h(r,\phi)$ to $h_{corr}(r,\phi)$:

$$h_{corr}(r,\phi) = h(r,\phi) + A_{corr}(d)\cdot Z_4(r,\phi).$$

Figure 1D:
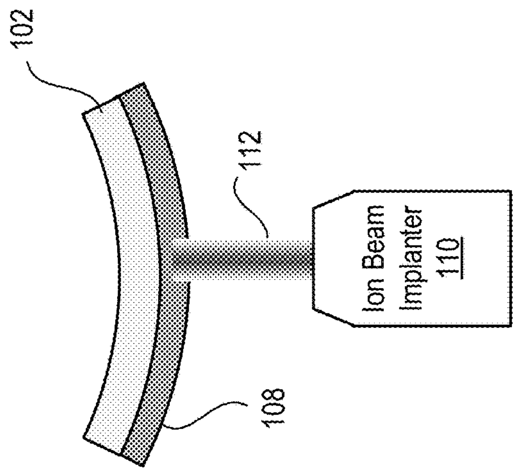

The overcorrection is chosen in conjunction with the implant species, energy, and dose to ensure maximum entitlement from the stress compensation. The overcorrection makes the combined structure of wafer 102 and stress-compensation layer 108 susceptible to further control of stress (and thus deformation of the wafer $h_{corr}(r,\phi)$). As illustrated in FIG. 1D, an ion beam implanter 110 can generate an ion beam 112 that strikes stress-compensation layer 108 and deposits ions therein. Ion beam 112 can carry silicon ions, phosphorus ions, argon ions, neon ions, xenon ions, krypton ions, and/or the like. In some embodiments, the energy and type of ions in ion beam 112 can be selected to limit the implanted ions to the volume of stress-compensation layer 108 without allowing the ions to reach wafer 102. Ions that lodge in stress-compensation layer 108 create substitution defects therein. Additionally, the ions leave a trail of vacancy defects along paths of propagation in stress-compensation layer 108. The substitution defects and/or vacancies modify (e.g., reduce) stress in stress-compensation layer 108 and can reduce the degree of stress overcorrection caused by the film deposition. This causes the combination of wafer 102 and stress-compensation layer 108 to flatten.

Although, for the sake of specificity, a stress-mitigation beam that is used to modify the stress in stress-compensation layer 108 is referred to as ion beam (e.g., ion beam 112) throughout this disclosure, the stress-mitigation beam (irradiation) can include other matter particles (e.g., electrons), electromagnetic waves (e.g., UV light, visible light, infrared light, etc.), and/or a suitable combination thereof. The stress-mitigation beam strikes stress-compensation layer 108 and changes the bonding network of stress-compensation layer 108. For example, the stress-mitigation beam of low energy may interact with surface atoms of stress-compensation layer 108, e.g., removing some of the surface atoms, effectively implementing etching of surface regions of stress-compensation layer 108. The effectiveness of such etching may be controlled by a choice of ion species/radicals/ambient gasses. In another example, the stress-mitigation beam of high energy can deposit ions inside stress-compensation layer 108. Ions and/or photons can break bonds of the bonding network (or crystal lattice) of stress-compensation layer 108 forming vacancies therein, and can further cause annealing due to local heating, UV curing, and/or other effects.

In some embodiments, the number of ions $\Delta Nj$ deposited per small area $\Delta A=\Delta x\Delta y$ of the wafer may be determined using simulations (performed as described in more detail below) based on the local value of the corrected deformation $h_{corr}(r,\phi)$, which may include a saddle deformation, a residual deformation, and the part of the paraboloid bow deformation $A_{corr}(d)+A_4$ that has been overcorrected by the deposition of stress-compensation layer 108. The desired local density $n(x,y)=\Delta N_i/\Delta x\Delta y$ of the ions can be delivered by controlling the scanning velocity v of ion beam 112. In some embodiments, ion beam 112 has a profile that can be approximated with a Gaussian function, e.g., the ion flux $j(\varphi)=j_0\exp(-x^2/a^2-y^2/b^2)$, where x and y are Cartesian coordinates, $j_0$ is the maximum ion flux at the center of the beam, and a and b is are characteristic spreads of the beam along the x-axis and y-axis, respectively. Correspondingly, a point that is located at distance y from the path of the center of the beam receives an ion dose that includes the following number of ions:

$$\frac{\Delta N_i}{\Delta x\Delta y}=\frac{j_0}{v}\int_{-\infty}^{\infty}dxe^{-x^2/a^2-y^2/b^2}=\frac{j_0\sqrt{\pi}}{va}e^{-y^2/b^2}.$$

Correspondingly, by reducing the scanning velocity v, the number of ions received by various regions of stress-compensation layer 108 can be increased, and vice versa. Additionally, ion beam 112 can perform multiple scans with different offsets y so that various points of stress-compensation layer 108 receive multiple doses of ions with different factors $e^{-y2/b2}$ that can average to a target dose. For example, after n passes of ion beam implanter 110, each made with a respective velocity $v_k$ at a different distance $y_k$ from the center of ion beam 112 to the area $\Delta x\Delta y$, the total dose of ions received by this area will be $$n(x,y)=\left.\frac{\Delta N_i}{\Delta x\Delta y}\right|_{total}=j_0\sqrt{\pi}\sum_{k=1}^{n}\frac{e^{-y_k^2/b^2}}{av_k}.$$

Figure 1E:
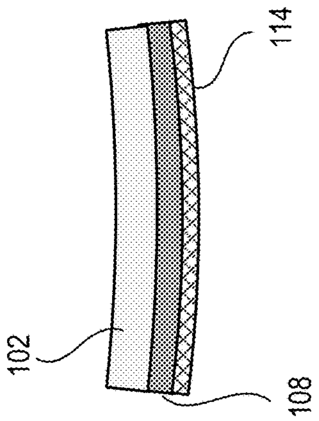

As illustrated in FIG. 1E, an implantation layer 114 formed as part of stress-compensation layer 108 results in a significant mitigation of deformation of wafer 102, and in particular its saddle and residual portions.

Figure 3:
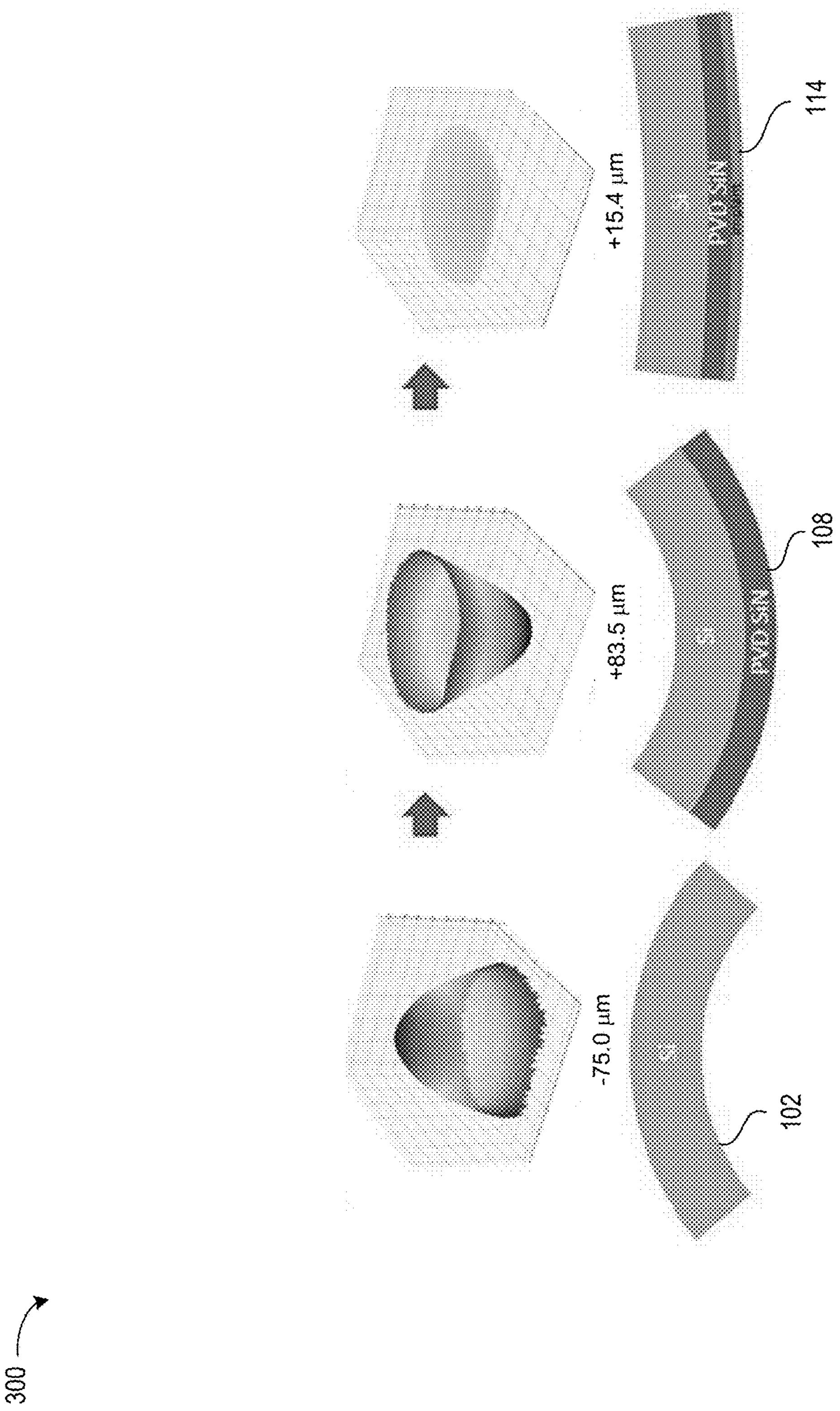
FIG. 3 illustrates stress and deformation mitigation in one example wafer using the process disclosed in relation to FIGS. 1A-E, according to at least one embodiment.
Figure 4:
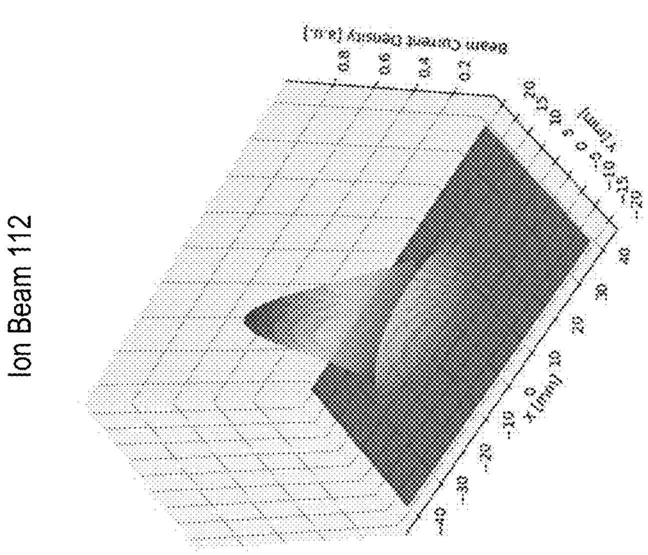
FIG. 4 illustrates one example profile of a Gaussian ion beam that can be used for stress and deformation mitigation in wafers, according to at least one embodiment.

FIG. 3 illustrates stress and deformation mitigation 300 in one example wafer using the process disclosed in relation to FIGS. 1A-E, according to at least one embodiment. As depicted in FIG. 3, a 30 cm Silicon wafer 102 with the maximum negative deformation of −75.0 μm is first overcorrected to the maximum deformation of +83.5 μm using a Silicon Nitride tensile stress-compensation layer 108. The stresses in stress-compensation layer 108 are then reduced by the formation of implantation layer 114 with an ion beam, resulting in a final maximum deformation of +15.4 μm. FIG. 4 illustrates one example profile 400 of a Gaussian ion beam 112 that can be used for stress and deformation mitigation in wafers, according to at least one embodiment.

The techniques of strain and deformation mitigation illustrated in FIGS. 1-3 can also be applied to a wafer having a complex deformation in which stress tensor components $\sigma_{xx}$ and $\sigma_{yy}$ have different signs causing the wafer to have a saddle deformation. FIG. 5 illustrates an example wafer 500 (e.g., a silicon wafer with a Silicon Nitride film deposited thereon) having a saddle-shaped deformation, according to at least one embodiment. As seen in the cross-sectional xz view 502, the stress component $\sigma_{xx}$ may be lower in the wafer (the top layer) than in the film (the bottom layer) deposited on the back side of the wafer. Conversely, as illustrated with the cross-sectional yz view 504, the stress component $\sigma_{yy}$ may be higher in the wafer than in the film. In some embodiments, the state of stress in the wafer may be represented by the location-dependent stress tensor which may be approximated as, $$\sigma(x,y)=\begin{pmatrix}\sigma_{xx}&\sigma_{xy}&\sigma_{xz}\\\sigma_{yx}&\sigma_{yy}&\sigma_{yz}\\\sigma_{zx}&\sigma_{zy}&\sigma_{zz}\end{pmatrix}\approx\begin{pmatrix}\sigma_{xx}&0&0\\0&\sigma_{yy}&0\\0&0&0\end{pmatrix}.$$

This structure of the stress tensor is usually a good approximation since the wafer is typically in a state of pure bending and independent of the shear stresses that are represented by the off-diagonal terms in the stress tensor. Correction of the saddle shape requires special handling in the computation of the dose map and optimization to ensure that additional residual terms are not introduced into the wafer as a result.

Figure 6:
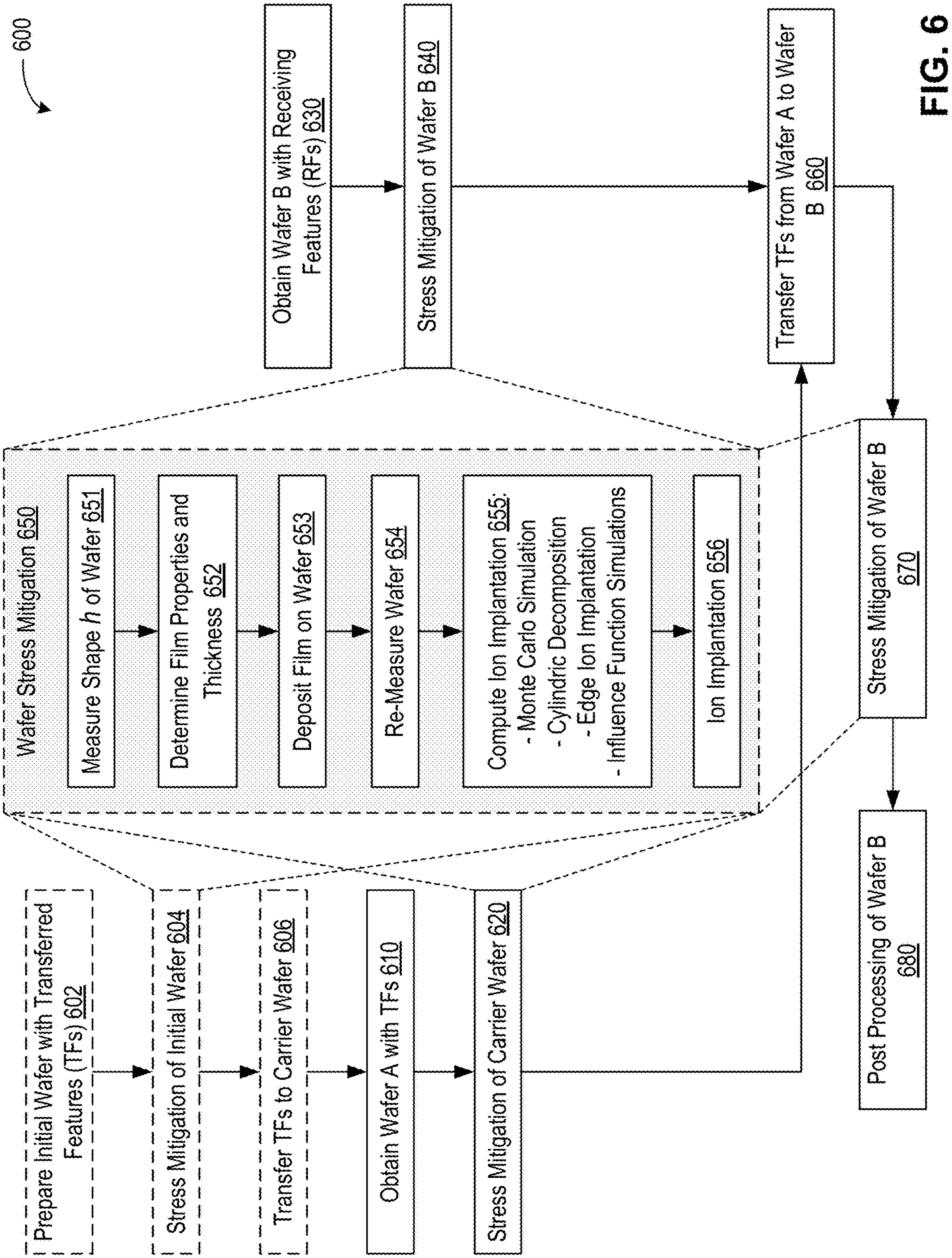
FIG. 6 is a flowchart illustrating an example process of wafer-to-wafer bonding that deploys stress compensation layer deposition and ion implantation, according to at least one embodiment.

FIG. 6 is a flowchart illustrating an example process 600 of wafer-to-wafer bonding that deploys stress compensation layer deposition and ion implantation, according to at least one embodiment. Process 600 can be performed using a semiconductor manufacturing system that includes one or more processing chambers, e.g., deposition chamber(s), plasma chamber(s), etching chamber(s), polishing chamber(s), film removal chamber(s), beam irradiation chamber(s), optical inspection chamber(s), and/or the like. The processing chambers can be connected to one or more transfer chambers, which can be equipped with robot(s) to handle wafers, e.g., moving wafers into and out of processing chambers. The transfer chamber can further be connected to a load-lock chamber (Front-End Interface) that can be coupled to one or more Front Opening Unified Pod carriers that hold bare wafers, processed wafers, partially processed wafers, and/or the like. Operations performed by the semiconductor manufacturing system, including any, some or all operations of process 600, can be performed responsive to instructions issued by a suitable computing device having a processing logic and memory to store the instructions.

At block 610, process 600 includes obtaining wafer A, which can be any wafer that is used in any suitable wafer-to-wafer bonding process, e.g., a silicon wafer, a glass wafer, a gallium arsenide wafer, a gallium nitride wafer, a silicon carbide wafer, a corundum wafer, and/or the like. Wafer A can have any features manufactured thereon that are to be transferred to wafer B, and which are referred to as transferred features (TFs) herein. For example, TFs can include dies with memory cells, logic circuits, optical circuits (e.g., photonic circuits), optoelectronic circuits, multiplexing/switching fabrics, and/or the like. In some embodiments, dies (or other TFs) can be deposited, etched, patterned, grown, and/or otherwise manufactured directly on wafer A.

Figures 7A, 7B, 7C, 7D:
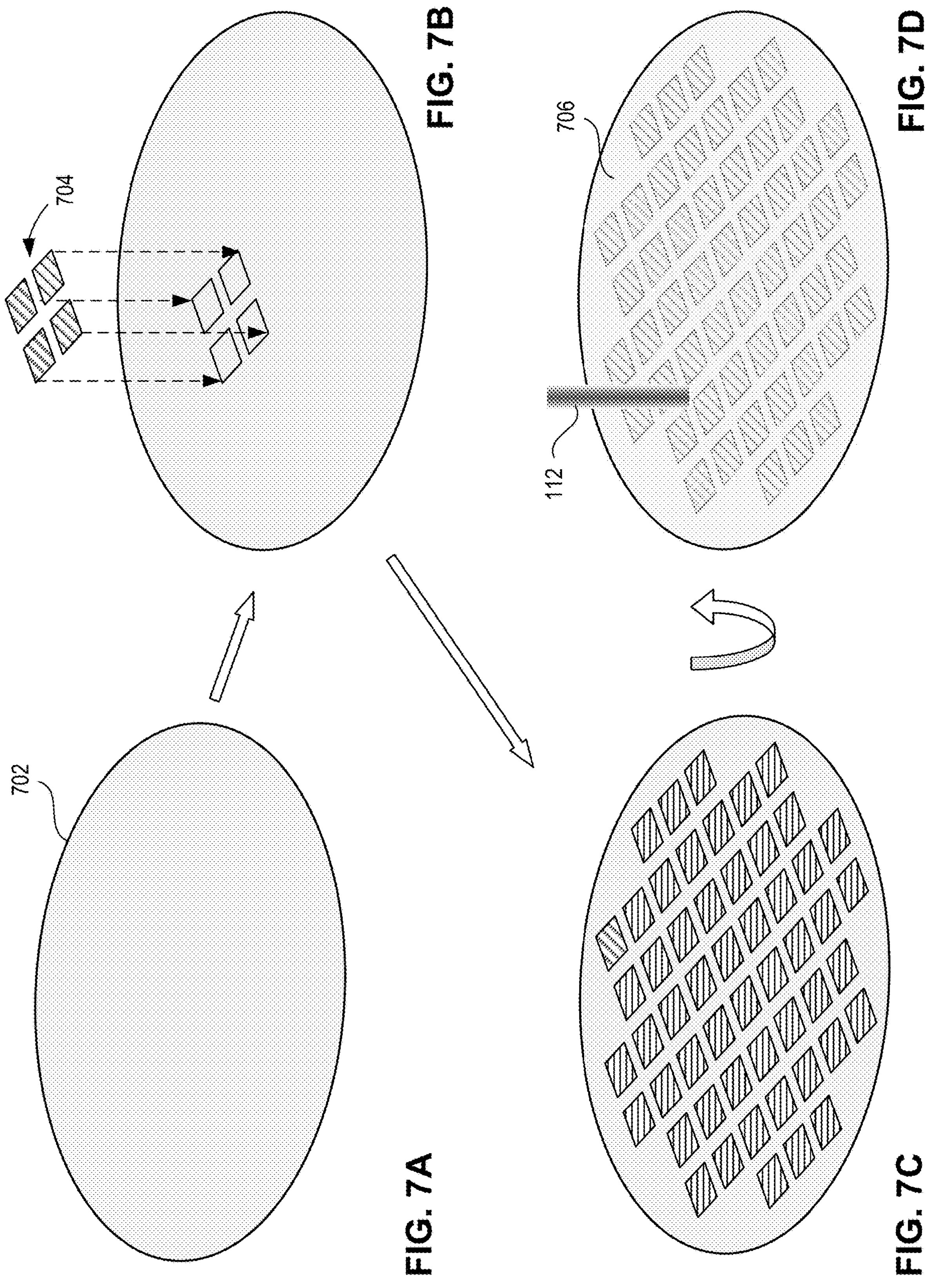
FIGS. 7A-7D illustrate schematically a preparation of wafer A with transferred features, according to at least one embodiment.

In some embodiments, TFs can first be manufactured on a different-initial-wafer, as indicated with block 602. In some embodiments, initial wafer with TFs can undergo, at block 604, wafer stress mitigation (as discussed below in conjunction with process 650) followed by a transfer of TFs to wafer A, which serves as a carrier wafer (block 606). For example, TFs can be prepared on the initial wafer and subsequently cut into individual pieces (e.g., dies) that are then placed on carrier wafer A. The placed TFs can be bonded, adhered, or otherwise secured on carrier wafer A. FIGS. 7A-7D illustrate schematically a preparation of wafer A with TFs, according to at least one embodiment. FIG. 7A shows a carrier wafer A 702, which can be grown, cut, polished, covered with adhesive film(s), and/or otherwise prepared for accepting TFs. TFs can be manufactured on a separate initial wafer (not shown in FIGS. 7A-7D). As depicted schematically in FIG. 7B, cut TFs 704 can be placed at target locations on wafer 702. FIG. 7C illustrates carrier wafer A with a set of TFs at the target locations. As illustrated in FIG. 7D, carrier wafer A can then be flipped and a stress-compensation layer 706 can be deposited on the back surface of carrier wafer A (e.g., as part of block 653 of wafer stress mitigation process 650 of FIG. 6) and ions can be implanted into stress-compensation layer 706 using ion beam 112 (e.g., as part of block 656 of wafer stress mitigation process 650 of FIG. 6).

Referring again to FIG. 6, wafer A can undergo stress mitigation, at block 620, as disclosed in more detail below.

Figure 8A:
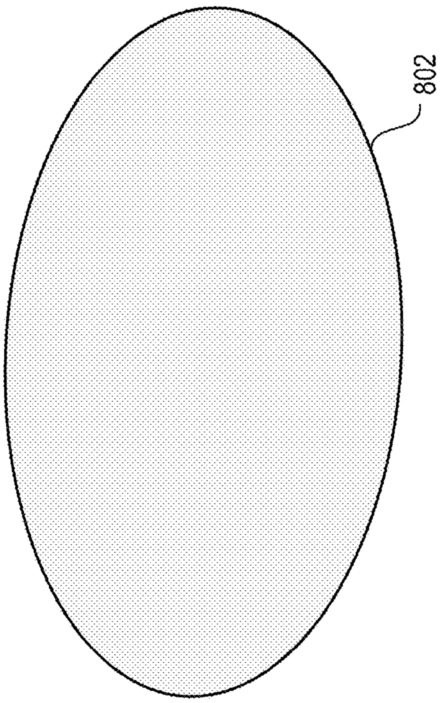
FIGS. 8A-8D illustrate schematically a preparation of wafer B with receiving features, according to at least one embodiment.
Figure 8B:
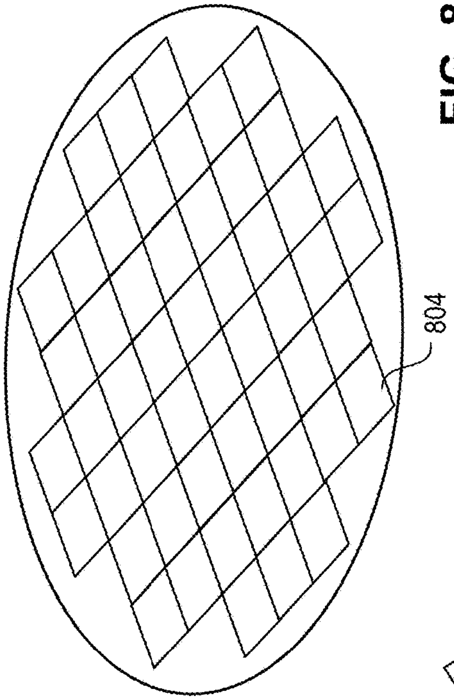
Figure 8C:
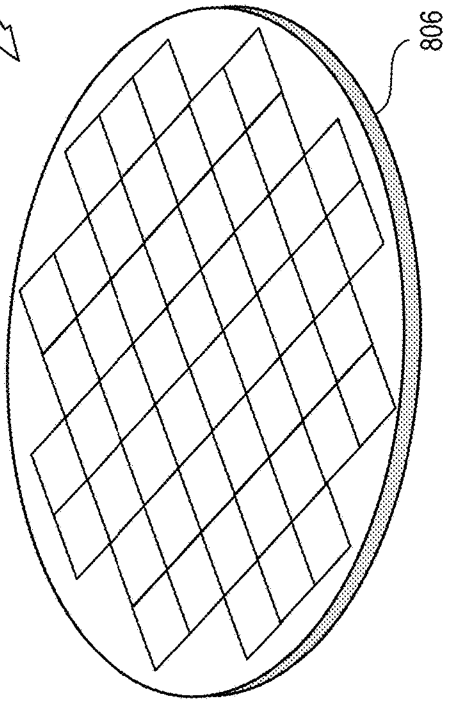
Figure 8D:
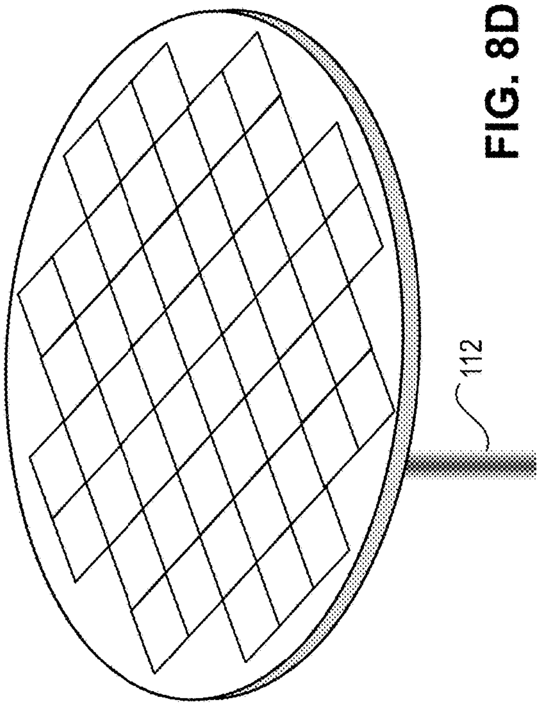

At block 630, process 600 includes obtaining wafer B, which can (similarly to wafer A) be any suitable wafer. Wafer B can have any features manufactured thereon that are to be matched to TFs transferred from wafer B, herein referred to as receiving features (RFs) of wafer B. For example, RFs can include any circuits (e.g., CMOS peripheral circuits), patterning, and/or the like. FIGS. 8A-8D illustrate schematically a preparation of wafer B with RFs, according to at least one embodiment. FIG. 8A shows wafer B 802, which can be grown, cut, polished, and/or otherwise prepared for manufacturing of RFs. As illustrated in FIG. 8B, RFs 804 can then be manufactured on wafer B using any suitable techniques of etching, depositions, cleaning, annealing, physical or chemical polishing, and/or the like. Wafer B 802 can then undergo stress mitigation (process 650 in FIG. 6). More specifically, as depicted schematically with FIG. 8C, a stress compensation layer 806 can be deposited on the back surface of wafer B 802 (e.g., as part of block 653 of wafer stress mitigation process 650 in FIG. 6). As depicted schematically in FIG. 8D, ions can be implanted into the stress-compensation layer 806 using ion beam 112 (e.g., as part of block 656 of wafer stress mitigation process 650 in FIG. 6).

In some instances, wafer A (with any number of features deposited, etched, and/or otherwise engineered thereon) can be adhered (bonded) to wafer B. In such instances, wafer A serves as carrier wafer (initial wafer) but remains adhered to wafer B (rather than serving as a carrier wafer to transferred features).

Figure 9B:
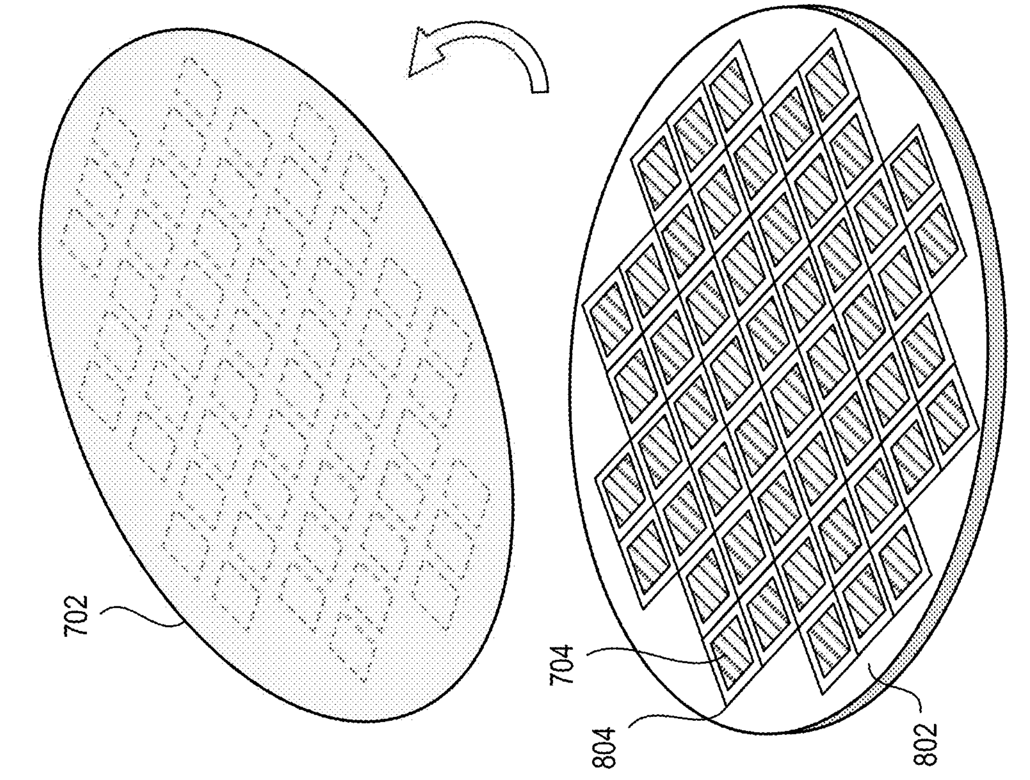
FIGS. 9A-9B illustrate schematically a transfer of features between two wafers, according to at least one embodiment.
Figure 9A:
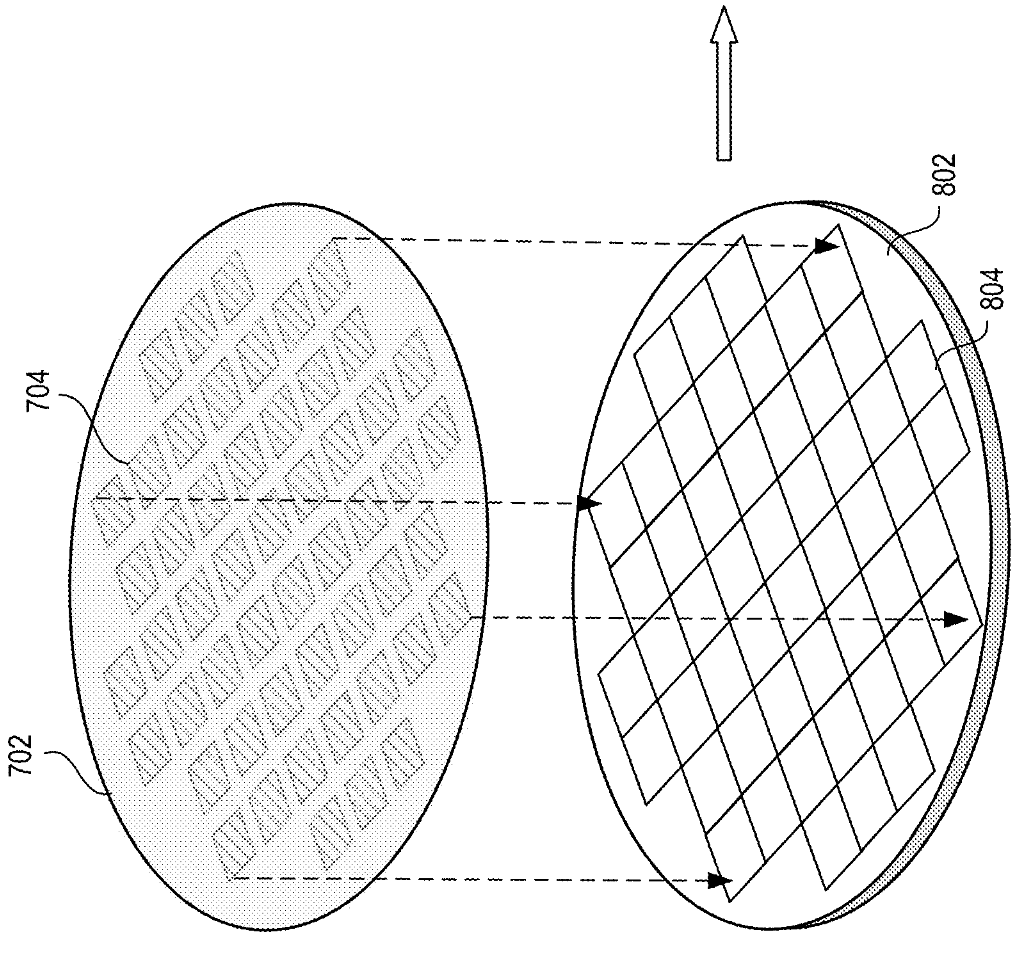

Referring again to FIG. 6, at block 640, the obtained wafer B can undergo stress mitigation, e.g., as disclosed in more detail below. At block 660, TFs can be transferred from wafer A to wafer B. FIGS. 9A-9B illustrate schematically a transfer of features between two wafers, according to at least one embodiment. More specifically, FIG. 9A illustrates alignment of TFs 704 hosted by carrier wafer A 702 with RFs 804 hosted by wafer B 802. Wafer A 702 and/or wafer B 802 can be stress-mitigated as disclosed in more detail below. After wafer A 702 adheres to wafer B 802, as illustrated in FIG. 9B, TFs 704 are transferred to locations that match locations of RFs 804, and carrier wafer A 702 can be removed (peeled off) wafer B 802 while TFs 704 remain adhered to wafer B 802.

Referring again to FIG. 6, wafer B with matched TFs and RFs can optionally undergo, at block 670, any additional stress mitigation. Furthermore, wafer B can undergo any suitable post-processing 680, which can include cleaning, replacing an insulating layer that separates TFs from RFs with a conducting material (e.g., to establish or improve electrical contacts between TFs and RFs), covering wafer B with a protective and/or insulating layer, and/or the like. Although block 680 is depicted in FIG. 6 as subsequent to block 670, in some embodiments, any or all operations of block 680 can be performed prior to any or all operations of block 670.

Stress mitigation of initial wafer (block 604), carrier wafer (block 620), wafer B (block 640 and/or block 670), and/or the like, can be performed using one or more operations of process 650.

More specifically, at block 651, a shape of a wafer (initial wafer, carrier wafer A, wafer B, etc.) can be measured. A displacement $h_w(\vec{r})$ of a surface (e.g., top surface or bottom surface) of the wafer can be represented as a function of radius-vector $\vec{r}$ using any suitable set of in-plane coordinates, e.g., polar coordinates, $h_w(r,\phi)$, Cartesian coordinates, $h_w(x,y)$, or any other coordinates. In some embodiments, wafer deformation $h_w(\vec{r})$ can be represented via a decomposition of the determined shape over a suitable set of basis functions, e.g., Zernike polynomials, or some other set of polynomials. The wafer deformation $h_w(\vec{r})$ can be caused by a deforming pressure applied to the top surface of the wafer as a result of local stresses caused by patterning/etching of the wafer, deposition of one or more films on the top surface of the wafer, and/or any other technological operations performed on the wafer.

At block 652, the determined deformation $h_w(\vec{r})$ can be used to identify properties (e.g., material and thickness) of a target stress-compensation film to be deposited on the wafer. In some implementations, the film can be selected in such as a way as to make the stress $\sigma_{WF}$ in the new wafer/film structure of a definite sign. In the example of FIG. 3, the bottom side of Si wafer 102 experiences a compressive stress, e.g., $\sigma_{WF}<0$. The stress-compensation layer 108 may be selected to cause the wafer stress at the bottom side of wafer 102 to reverse sign and become tensile throughout the whole area of the wafer, $\sigma_{WF}>0$. This is advantageous because ion implantation can reduce the amount of stress in the film while reversing the sign of the tension in the film with ions may be more difficult.

At block 653 of FIG. 6, process 600 can include depositing the film (stress-compensation layer) of the selected material and thickness on the wafer. In some implementations, process 600 can include re-measuring 654 (e.g., using optical interferometry) the wafer deformation $h_{WF}(\vec{r})$ modified by the film. In some implementations, instead of performing the re-measurement, the modified wafer deformation $h_{WF}(\vec{r})$ can be estimated.

The measured (and/or estimated) deformation $h_{WF}(\vec{r})$ of the wafer can be used to determine a ion implantation dose map $n(\vec{r})$ that mitigates the stress $\sigma_{WF}(\vec{r})$ and reduces deformation to zero (or near zero), $h_{WF}(\vec{r})\rightarrow 0$. Non-uniform ion implantation causes the uniform pressure exerted by the film to be reduced by an amount determined by a properly chosen local ion dose $n(\vec{r})$.

Operations of block 655 can include one or more techniques to determine $n(\vec{r})$. In some embodiments, ion implantation map $n(\vec{r})$ can be computed using statistical, e.g., Monte Carlo simulations. For example, stored measurement data can be collected from previously (e.g., historically) performed measurements of ion multiple types of SCL materials, thicknesses of SCLs, types of particles (e.g., photons, electrons, ions of various types, etc.), angles of incidence, and/or other parameters. The stored measurement data can be statistically processed and stored (e.g., in a memory of a processing device performing the Monte Carlo simulations) in the form of probability distributions of various quantities, e.g., distribution of the density of ion implantation with depth for different ion types, ion energies, angles of incidence, distribution of the number of vacancies produced at different depths (per unit of length of travel of the ions) for different ion types, ion energies, and angles of incidence, distribution of stresses created by implanted ions for different densities of ion implantation and/or the number of produces vacancies, and/or the like. Performing the Monte Carlo simulation can include sampling from the stored statistical distributions and identifying a likelihood that a target stress mitigation will be achieved with various specific settings of SCL and/or stress-mitigation beam (e.g., ion beams).

In some embodiments, ion implantation map $n(\vec{r})$ can be computed using cylindric decomposition of $h_{WF}V(\vec{r})$. In some embodiments, ion implantation map $n(\vec{r})$ can be computed for selected edge regions of the stress-compensation layer (e.g., to mitigate a cylindric deformation or a saddle deformation) and, optionally, using assist feature-based ion implantation assist features into the area of the film (e.g., to mitigate a residual non-quadratic wafer deformation). In some embodiments, the implantation map $n(\vec{r})$ can be computed using an influence function $G(\vec{r};\vec{r})$ that can be analytically computed, experimentally measured, and/or determined using computational simulations. In some embodiments, a combination of multiple techniques of ion implantation computations can be used.

Figure 10A:
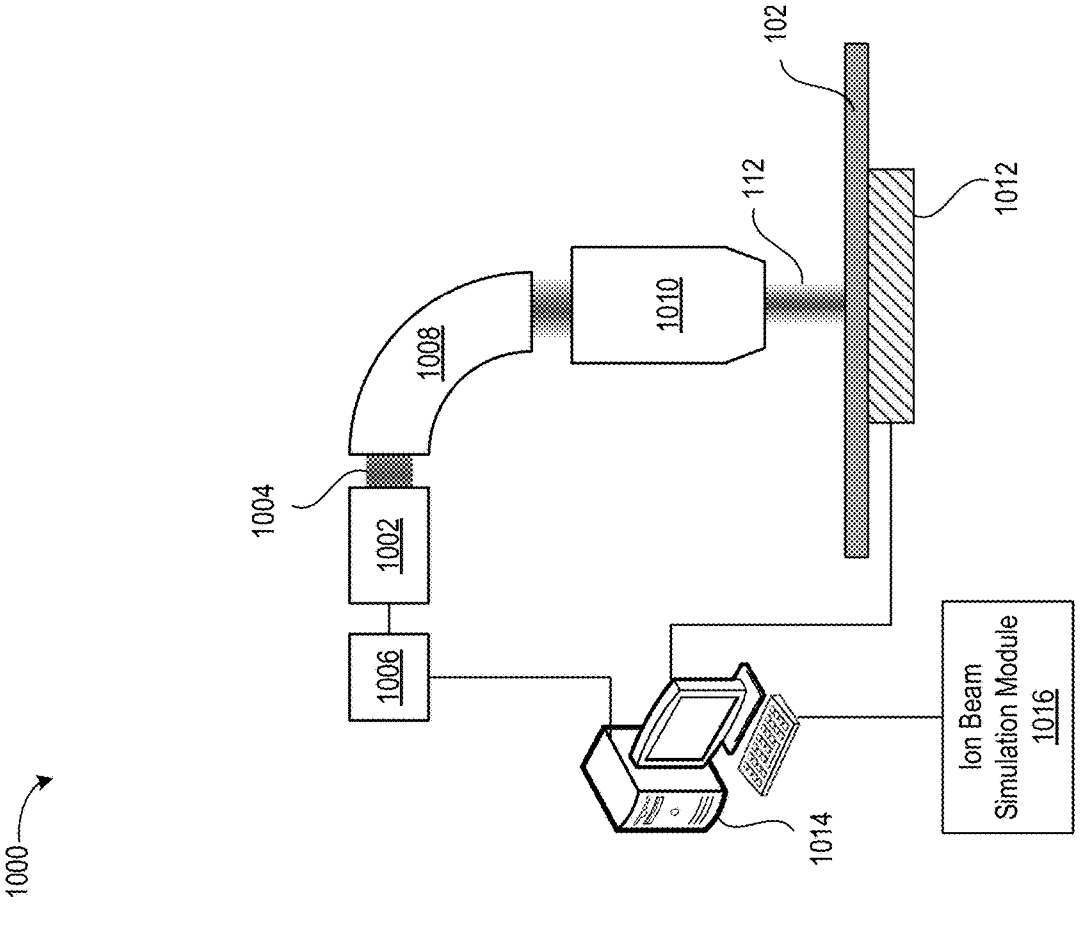
FIG. 10A illustrates schematically an ion implantation system capable of performing ion implantation into stress-compensation layers, according to at least one embodiment.

FIG. 10A illustrates schematically an ion implantation system 1000 capable of performing ion implantation into stress-compensation layers, according to at least one embodiment. Ion implantation system 1000 may be a part of a semiconductor manufacturing system that includes one or more processing chambers that process a wafer. Ion implantation system 1000 can be or include ion beam implanter 110 of FIG. 1. Although, for the sake of specificity, a stress-mitigation beam that is used to modify the stress in a stress-compensation layer 108 is referred to as ion beam (e.g., ion beam 112), in some embodiments, the stress-mitigation beam can include other matter particles (e.g., electrons), electromagnetic waves (e.g., UV light, visible light, infrared light, etc.), and/or a suitable combination thereof. Ion implantation system 1000 can include and ion source 1002 for producing an ion beam 1004. Ion source 1002 can include a chamber for generating ions (e.g., a plasma chamber). Ion source 1002 can be powered by a power source 1006 and can include an extraction electrode assembly (not shown). Ion implantation system 1000 can include a mass spectrometer 1008 and a collimating and focusing column 1010. Collimating and focusing column 1010 can direct ion beam 112 to wafer 102. Wafer 102 can be supported by a support stage 1012. In some embodiments, support stage 1012 and wafer 102 can remain stationary during scanning of wafer 102 by ion beam 112 while components of ion implantation system 1000 can be repositioned relative to wafer 102. In some embodiments, ion implantation system 1000 can be stationary while support stage 1012 can reposition wafer 102. Scanning with ion beam 112 can occur along multiple directions, e.g., along x-axis and along y-axis according to any suitable predetermined pattern, e.g., back- and forth along x-axis, in a spiral pattern, and so on. In various embodiments, ion beam 112 can be scanned at a frequency of several Hz, tens of Hz, hundreds of Hz, thousands of Hz, or more.

Operations of ion implantation system 1000 can be controlled by a controller 1014, which can include any suitable computing device, microcontroller, or any other processing device having a processor, e.g., a central processing unit (CPU), a field-programmable gate array (FPGA), an application-specific integrated circuit (ASIC), and/or the like, and a memory device, e.g., a random-access memory (RAM), read-only memory (ROM), flash memory, and/or the like or any combination thereof. Controller 1014 can control operations of power source 1006, support stage 1012, and/or various other components and modules of ion implantation system 1000. Controller 1014 can include an ion beam simulation module 1016 capable of performing simulations that determine a target intensity of ion beam 112 to be used to mitigate various wafer deformations. In some embodiments, support stage 1012 can impart a tilt, e.g., in one or two spatial directions to wafer 102 to change an angle of incidence of ion beam 112 relative to wafer 102. In some embodiments, instead of tilting wafer 102, controller 1014 can cause a tilt of ion implantation system 1000 relative to wafer 102.

Figure 10B:
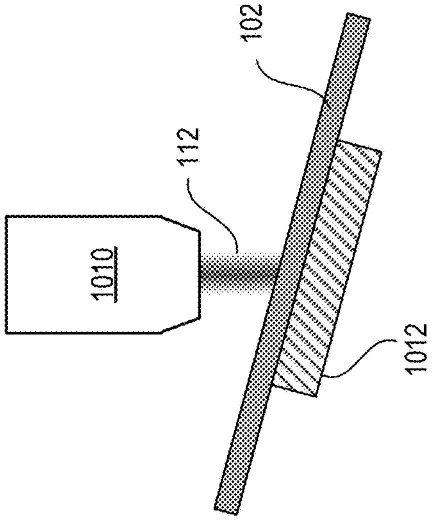
FIG. 10B illustrates a delivery of ions to a wafer at an arbitrary angle of incidence by the ion implantation system of FIG. 10A, according to at least one embodiment.
Figure 11:
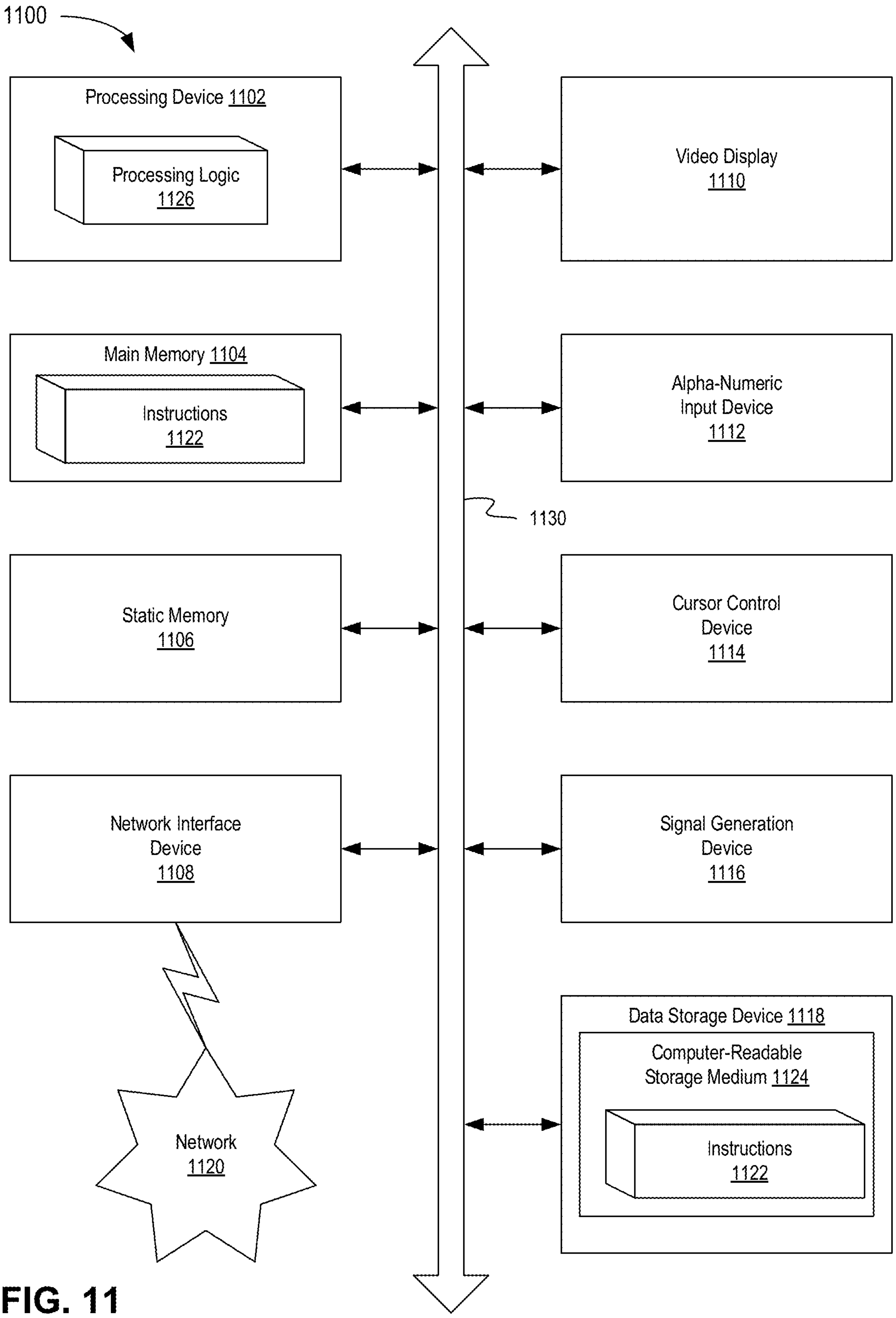
FIG. 11 depicts a block diagram of an example computer system capable of supporting operations of the present disclosure, according to at least one embodiment.

FIG. 11 depicts a block diagram of an example computer system 1100 capable of supporting operations of the present disclosure, according to at least one embodiment. In various illustrative examples, example computer system 1100 may be or include controller 1014 of FIG. 10. Example computer system 1100 may be connected to other computer systems in a LAN, an intranet, an extranet, and/or the Internet. Computer system 1100 may operate in the capacity of a server in a client-server network environment. Computer system 1100 may be a personal computer (PC), a set-top box (STB), a server, a network router, switch or bridge, or any device capable of executing a set of instructions (sequential or otherwise) that specify actions to be taken by that device. Further, while only a single example computer system is illustrated, the term "computer" shall also be taken to include any collection of computers that individually or jointly execute a set (or multiple sets) of instructions to perform any one or more of the methods discussed herein.

Example computer system 1100 may include a processing device 1102 (also referred to as a processor or CPU), a main memory 1104 (e.g., read-only memory (ROM), flash memory, dynamic random access memory (DRAM) such as synchronous DRAM (SDRAM), etc.), a static memory 1106 (e.g., flash memory, static random access memory (SRAM), etc.), and a secondary memory (e.g., a data storage device 1118), which may communicate with each other via a bus 1130.

Processing device 1102 represents one or more general-purpose processing devices such as a microprocessor, central processing unit, or the like. Processing device 1102 can include processing logic 1126. Processing device 1102 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 1102 may be configured to execute instructions implementing example process 600 of wafer-to-wafer bonding that deploys stress compensation layer deposition and ion implantation.

Example computer system 1100 may further comprise a network interface device 1108, which may be communicatively coupled to a network 1120. Example computer system 1100 may further comprise a video display 1110 (e.g., a liquid crystal display (LCD), a touch screen, or a cathode ray tube (CRT)), an alphanumeric input device 1112 (e.g., a keyboard), a cursor control device 1114 (e.g., a mouse), and an acoustic signal generation device 1116 (e.g., a speaker).

Data storage device 1118 may include a computer-readable storage medium (or, more specifically, a non-transitory computer-readable storage medium) 1124 on which is stored one or more sets of executable instructions 1122. In accordance with one or more aspects of the present disclosure, executable instructions 1122 may comprise executable instructions implementing example process 600 of wafer-to-wafer bonding that deploys stress compensation layer deposition and ion implantation.

Executable instructions 1122 may also reside, completely or at least partially, within main memory 1104 and/or within processing device 1102 during execution thereof by example computer system 1100, main memory 1104 and processing device 1102 also constituting computer-readable storage media. Executable instructions 1122 may further be transmitted or received over a network via network interface device 1108.

While the computer-readable storage medium 1124 is shown in FIG. 11 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, CD-ROMs, and magnetic-optical disks, read-only memories (ROMs), random access memories (RAMs), EPROMs, EEPROMs, magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description below. In addition, the scope of the present disclosure is not limited to any particular programming language. It will be appreciated that a variety of programming languages may be used to implement the teachings of the present disclosure.

It is to be understood that the above description is intended to be illustrative, and not restrictive. Many other embodiment examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A method comprising:

obtaining a first substrate supporting one or more transferred features (TFs);

transferring the one or more TFs from the first substrate to a second substrate;

applying stress mitigation to a target substrate, wherein the target substrate comprises at least one of:

the first substrate, an auxiliary substrate supporting the one or more TFs prior to transferring the one or more TFs from the auxiliary substrate to the first substrate, or the second substrate;

wherein applying stress mitigation to the target substrate comprises:

obtaining, using optical inspection data, an out-of-plane deformation (OPD) profile of the target substrate;

causing a stress compensation layer (SCL) to be deposited on the target substrate; and exposing the SCL to a stress-mitigation beam, wherein settings of at least one or more of (i) the SCL or (ii) the stress-mitigation beam are determined using the OPD profile of the target substrate.

2. The method of claim 1, wherein the second substrate supports one or more receiving features (RFs), and wherein transferring the one or more TFs from the first substrate to the second substrate comprises aligning the one or more TFs relative to the one or more RFs.

3. The method of claim 1, wherein the settings are determined using a plurality of polynomial coefficients of a polynomial decomposition of the OPD profile of the target substrate, each of the plurality of polynomial coefficients characterizing a respective one of a plurality of elemental deformation shapes of the target substrate, and wherein the settings comprise one or more of:

a material of the SCL, a thickness of the SCL, a type of particles of the stress-mitigation beam, an energy of the particles of the stress-mitigation beam, or an angle of incidence of the particles of the stress-mitigation beam on the SCL.

4. The method of claim 3, wherein the plurality of elemental deformation shapes of the target substrate comprises a paraboloid deformation of the target substrate and a saddle deformation of the target substrate.

5. The method of claim 3, wherein the polynomial decomposition of the OPD profile of the target substrate comprises decomposition of the profile over Zernike polynomials.

6. The method of claim 1, wherein the settings of the stress-mitigation beam are determined using a plurality of statistical simulations that comprise sampling from one or more statistical distributions associated with previous applications of the stress-mitigation beam.

7. The method of claim 1, wherein exposing the SCL to the stress-mitigation beam comprises:

exposing a plurality of edge regions of the SCL to an azimuthally-varying dose of the stress-mitigation beam, wherein location of the edge regions is determined using orientation of principal axes of the OPD profile of the target substrate.

8. The method of claim 7, wherein each of the plurality of edge regions of the SCL has a width that is at or below 30% of a diameter of the target substrate.

9. The method of claim 1, wherein exposing the SCL to the stress-mitigation beam comprises delivering, to the SCL, at least one of:

a spatially uniform dose of ions, a radially-varying dose of ions, or an azimuthally-varying dose of ions.

10. The method of claim 1, wherein obtaining the OPD profile of the target substrate comprises:

identifying one or more cylindric decompositions of a quadratic part of the OPD profile.

11. The method of claim 10, wherein the one or more cylindric decompositions comprise:

a first cylindric decomposition comprising an upward-facing cylindric contribution to the OPD profile of the target substrate, and a second cylindric decomposition comprising a downward-facing cylindric contribution to the OPD profile of the target substrate;

the method further comprising:

selecting, from the first cylindric decomposition or the second cylindric decomposition, a cylindric decomposition with a lower-magnitude parabolic contribution to the OPD profile of the target substrate; and using the selected cylindric decomposition to determine the settings.

12. The method of claim 1, wherein the settings are determined using:

obtaining a dataset comprising a representation of an influence function for the target substrate, wherein the influence function characterizes deformation response of the target substrate caused by a point-like mechanical influence;

performing a regression computation to determine, based on the OPD profile of the target substrate and in view of the influence function, a distribution of ion implants into the SCL, wherein the distribution of ion implants is to mitigate the OPD of the target substrate; and performing ion implantation into the SCL in view of the determined distribution of ion implants.

13. The method of claim 12, wherein the influence function is determined using one or more experiments, wherein each of the one or more experiments comprises measuring a reference substrate OPD caused by a reference stress-mitigation beam directed into a reference SCL deposited on the reference substrate.

14. A system comprising:

a memory; and a processing device communicatively coupled to the memory, the processing device is to cause performance of operations comprising:

obtaining a first substrate supporting one or more transferred features (TFs);

transferring the one or more TFs from the first substrate to a second substrate;

applying stress mitigation to a target substrate, wherein the target substrate comprises at least one of:

the first substrate, an auxiliary substrate supporting the one or more TFs prior to transferring the one or more TFs from the auxiliary substrate to the first substrate, or the second substrate;

wherein applying stress mitigation to the target substrate comprises:

obtaining, using optical inspection data, an out-of-plane deformation (OPD) profile of the target substrate;

causing a stress compensation layer (SCL) to be deposited on the target substrate; and exposing the SCL to a stress-mitigation beam, wherein settings of at least one or more of (i) the SCL or (ii) the stress-mitigation beam are determined using the OPD profile of the target substrate.

15. The system of claim 14, wherein the second substrate supports one or more receiving features (RFs), and wherein transferring the one or more TFs from the first substrate to the second substrate comprises aligning the one or more TFs relative to the one or more RFs.

16. The system of claim 14, wherein the settings are determined using a plurality of polynomial coefficients of a polynomial decomposition of the OPD profile of the target substrate, each of the plurality of polynomial coefficients characterizing a respective one of a plurality of elemental deformation shapes of the target substrate, and wherein the settings comprise one or more of:

a material of the SCL, a thickness of the SCL, a type of particles of the stress-mitigation beam, an energy of the particles of the stress-mitigation beam, or an angle of incidence of the particles of the stress-mitigation beam on the SCL.

17. The system of claim 16, wherein the polynomial decomposition of the OPD profile of the target substrate comprises decomposition of the profile over Zernike polynomials.

18. The system of claim 14, wherein exposing the SCL to the stress-mitigation beam comprises:

exposing a plurality of edge regions of the SCL to the stress-mitigation beam.

19. The system of claim 14, wherein exposing the SCL to the stress-mitigation beam comprises delivering, to the SCL, at least one of:

a spatially uniform dose of ions, a radially-varying dose of ions, or an azimuthally-varying dose of ions.

20. A semiconductor manufacturing system, comprising:

one or more processing chambers to process a substrate; and a computing device to cause performance of operations comprising:

obtaining a first substrate supporting one or more transferred features (TFs);

transferring the one or more TFs from the first substrate to a second substrate;

applying stress mitigation to a target substrate, wherein the target substrate comprises at least one of:

the first substrate, an auxiliary substrate supporting the one or more TFs prior to transferring the one or more TFs from the auxiliary substrate to the first substrate, or the second substrate;

wherein applying stress mitigation to the target substrate comprises:

obtaining, using optical inspection data, an out-of-plane deformation (OPD) profile of the target substrate;

causing a stress compensation layer (SCL) to be deposited on the target substrate; and exposing the SCL to a stress-mitigation beam, wherein settings of at least one or more of (i) the SCL or (ii) the stress-mitigation beam are determined using the OPD profile of the target substrate.

* * * * *